United States Patent
Choi et al.

(10) Patent No.: US 8,328,940 B2
(45) Date of Patent: *Dec. 11, 2012

(54) APPARATUS FOR TRANSFERRING A SUBSTRATE

(75) Inventors: Jae-Wook Choi, Seoul (KR); Young-Rok Kim, Yongin-si (KR)

(73) Assignee: Jusung Engineering Co., Ltd., Gwangju-si, Gyeongi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/041,338

(22) Filed: Mar. 4, 2011

(65) Prior Publication Data

US 2011/0150608 A1   Jun. 23, 2011

Related U.S. Application Data

(63) Continuation of application No. 11/083,838, filed on Mar. 16, 2005, now Pat. No. 7,905,960.

(30) Foreign Application Priority Data

Mar. 24, 2004   (KR) .................. 10-2004-0019996
Jul. 28, 2004    (KR) .................. 10-2004-0059042

(51) Int. Cl.
*C23C 16/00*   (2006.01)
*H01L 21/306*   (2006.01)

(52) U.S. Cl. ............... 118/719; 156/345.32; 414/935; 414/939

(58) Field of Classification Search ....... 156/345.31–32; 901/8, 15–16; 414/935

See application file for complete search history.

(56) References Cited

U.S. PATENT DOCUMENTS

| | | | |
|---|---|---|---|
| 5,564,889 A * | 10/1996 | Araki | ............ 414/806 |
| 6,109,860 A | 8/2000 | Ogawa et al. | |
| 6,176,668 B1 | 1/2001 | Kurita et al. | |
| 6,235,634 B1 | 5/2001 | White et al. | |
| 2001/0041129 A1 | 11/2001 | Tsuneda et al. | |
| 2002/0044855 A1 | 4/2002 | Davis | |
| 2002/0134506 A1 | 9/2002 | Franklin et al. | |
| 2003/0136515 A1 | 7/2003 | Saeki et al. | |
| 2003/0155076 A1 | 8/2003 | Murakami | |
| 2004/0226510 A1 | 11/2004 | Hanson et al. | |

FOREIGN PATENT DOCUMENTS

| | | |
|---|---|---|
| CN | 1308565 | 8/2001 |
| CN | 1446742 | 10/2003 |
| KR | 19980014228 | 4/1998 |

* cited by examiner

*Primary Examiner* — Karla Moore
*Assistant Examiner* — Nathan K Ford
(74) *Attorney, Agent, or Firm* — Renaissance IP Law Group LLP

(57) ABSTRACT

In one embodiment, a transfer robot for transferring a substrate includes a supporting means, a transfer robot arm including a first sub-robot arm and a second sub-robot arm arranged over the supporting means, an inner rail and an outer rail adjacent to the inner rail overlying the supporting means. The first sub-robot arm is adapted to move in a straight line motion along the inner rail and the second sub-robot arm is adapted to move in a straight line motion along the outer rail. The second sub-robot arm surrounds the first sub-robot arm.

20 Claims, 10 Drawing Sheets

APPARATUS FOR TRANSFERRING A SUBSTRATE

This application is a Continuation Application of U.S. application Ser. No. 11/083,838 filed Mar. 16, 2005, which claims the benefit of Korean Patent Applications No. 2004-0019996 filed in Korea on Mar. 24, 2004 and No. 2004-0059042 filed in Korea on Jul. 28, 2004, the contents of which are hereby incorporated herein by reference in their entirety.

BACKGROUND

1. Technical Field

The present invention relates to an apparatus for manufacturing a substrate for a semiconductor device, a liquid crystal display device and so on.

2. Discussion of the Related Art

To manufacture, in general, a deposition process of depositing a thin film, a photolithography process of light-exposing or light-shielding a selected region of the thin film using a photosensitive material, an etching process of removing the selected region and a cleaning process of removing residuals are repeated several times.

Such respective processes are conducted in an apparatus including respective process chambers. Recently, as the apparatus is used a cluster which includes a transferring chamber transferring the substrate and a load-lock chamber storing the substrate temporarily and connected to the transferring chamber as well as the multiple process chambers. The cluster includes a process chamber such as a plasma-enhanced chemical vapor deposition (PECVD) device and a dry etcher.

Figure 1:
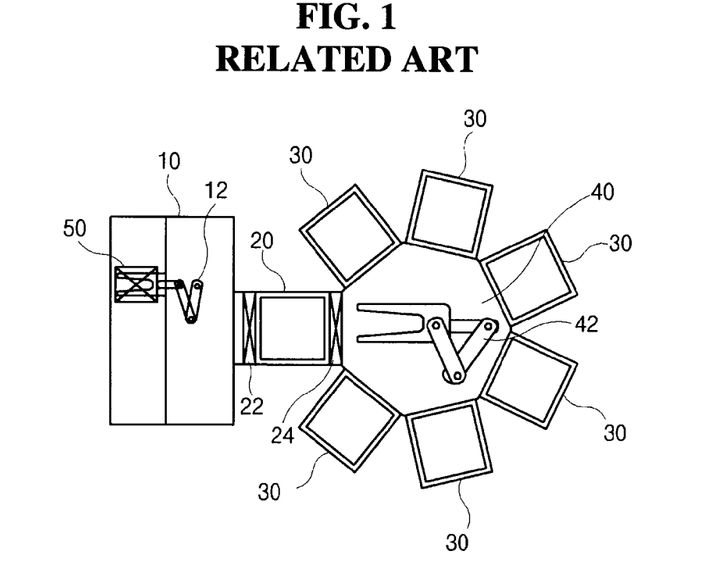
FIG. 1 is a schematic view of a cluster according to the related art.

FIG. 1 is a schematic view of a cluster according to the related art.

As shown in FIG. 1, a cluster includes a load-lock chamber 20, a transferring chamber 40 and a plurality of process chambers 30. The load-lock chamber 20 is connected to a storing portion 10 loading a plurality of substrates 50.

In the transferring chamber 40, a transferring chamber robot 42 is arranged to transfer the substrate 50 between the load-lock chamber 20 and the process chambers 30. In the storing portion 10, a storing portion robot 12 is arranged to input the substrate 50 to the load-lock chamber 20 and to output the substrate 50 from the load-lock chamber 20.

Meanwhile, a portion of the process chambers 30 may be used as a chamber for preheating or cooling the substrate 50 prior to inputting the substrate 50 to the process chamber 30. Furthermore, a number of the load-lock chamber 20 and the process chamber 30 may be varied.

Hereinafter, the moving process of the substrate will be explained in processes for manufacturing the substrate using the related art cluster.

At first, the storing portion robot 12 inputs the substrate 50 from the storing portion 10 to the load-lock chamber 20. At this time, the load-lock chamber 20 is under atmospheric pressure, and a first door 24 to the transferring chamber 40 is close.

When the substrate 50 is placed on the load-lock chamber 20 and the storing portion robot 12 goes out of the load-lock chamber 20, a second door 22 to the storing portion 10 is close and a pumping process is conducted to make the load-lock chamber 20 under vacuum.

When vacuum of the load-lock chamber 20 is equal to that of the process chamber 30 or the transferring chamber 40, the first door 24 is open and the transferring chamber robot 42 transfers the untreated substrate 50 from the load-lock chamber 20 to the process chamber 30.

When the substrate 50 is inputted into the process chamber 30, a process depending upon the process chamber 50 is conducted. When the process is finished in the process chamber 50, the transferring chamber robot 42 goes into the process chamber 30 and outputs the substrate 50. Then, when the substrate 50 is placed on the load-lock chamber 20, the storing portion robot 12 outputs it to the storing portion 10.

In the related art cluster as the apparatus for manufacturing the substrate, the transferring chamber has a polygon shape, and the process chambers are arranged along the outline of the transferring chamber. Therefore, a number and an arrangement of the process chambers are restricted.

Recently, the process chamber and the transferring chamber have larger sizes as the substrate has a larger size. However, an increase rate for sizes of the process chamber and the transferring chamber is greater than that of the substrate, in particular, an increase rate for the transferring chamber is greater than that of the process chamber. Therefore, a space for establishing the apparatus for manufacturing the substrate increases greatly.

SUMMARY

According to one embodiment, an apparatus for transferring a substrate may include a supporting means, a transfer robot arm including a first sub-robot arm and a second sub-robot arm arranged over the supporting means, an inner rail and an outer rail adjacent to the inner rail overlying the supporting means. The first sub-robot arm is adapted to move in a straight line motion along the inner rail and the second sub-robot arm is adapted to move in a straight line motion along the outer rail. The second sub-robot arm may surround the first sub-robot arm.

According to an embodiment, the inner rail and the outer rail may be arranged on the same plane.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 6 to 10B are cross-sectional views of a transferring chamber robot having structures different from that of FIG. 3A;

DETAILED DESCRIPTION OF THE PREFERRED EMBODIMENTS

Reference will now be made in detail to the preferred embodiments, examples of which are illustrated in the accompanying drawings.

Figure 2:
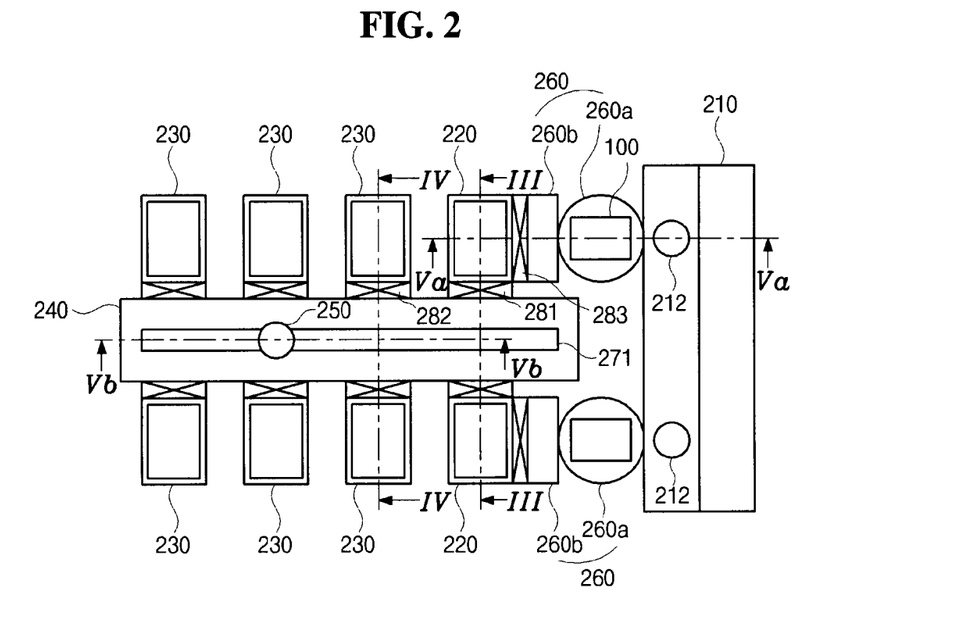
FIG. 2 is a schematic view of an apparatus for manufacturing a substrate according to the first embodiment of the present invention.

FIG. 2 is a view of an apparatus for manufacturing a substrate according to the first embodiment of the present invention.

An apparatus for manufacturing a substrate transfers a substrate 100 in an In-Line type. A transferring chamber 240 and a plurality of process chambers 230 are arranged to transfer the substrate 100 along a straight line.

As shown in FIG. 2, the apparatus includes the transferring chamber 240 extended along one direction, the plurality of process chambers 230 and a plurality of load-lock chambers 220 at both sides of the transferring chamber 240 along a long axis of the transferring chamber 240, and a storing portion 210. The apparatus further includes a delivering portion 260 rotating and delivering the substrate 100 between the storing portion 210 and the load-lock chamber 220.

In FIG. 2, the process chambers 230 and the load-lock chambers 220 are arranged symmetrically at both sides of the transferring chamber 240. However, it should be understood that the process chambers 230 and the load-lock chambers 220 be arranged in other type, for example, at one side of the transferring chamber 240.

In the transferring chamber 240, a horizontal moving axis 271 along the long axis of the transferring chamber 240 and a transferring chamber robot 250 moving along the horizontal moving axis 271 are arranged. In the storing portion 210 is arranged a storing portion robot 212 inputting the substrate 100 to the delivering portion 260 and outputting the substrate 100 from the delivering portion 260.

Figure 3A:
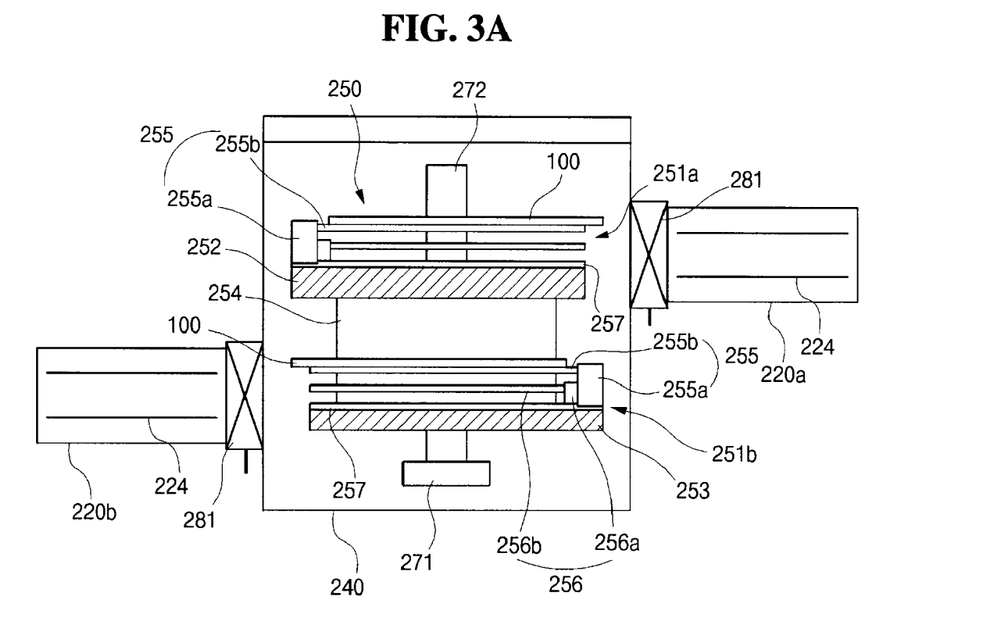
FIG. 3A is a cross-sectional view, which shows a connection structure of a transferring chamber and a load-lock chamber, taken along a line of FIG. 2.

FIG. 3A is a cross-sectional view, which shows a connection structure of a transferring chamber and a load-lock chamber, taken along a line III-III of FIG. 2. In FIG. 3A, the transferring chamber is under vacuum, and the load-lock chamber 220 is under atmospheric pressure or vacuum.

As shown in FIG. 3A, the load-lock chambers 220 include first and second load-lock chambers 220a and 220b which are arranged at both sides of the transferring chamber 240. The first and second load-lock chambers 220a and 220b have different heights from each other, in other words, the first load-lock chamber 220a may be higher than the second load-lock chamber 220b. The transferring chamber robot 250 includes upper and lower robot arms 251a and 251b. The upper and lower robot arms 251a and 251b, which correspond to the first and second load-lock chambers 220a and 220b, respectively, have different heights from each other to deliver effectively the substrate 100 between the load-lock chamber 220 and the transferring chamber 240.

The upper robot arm 251a transfers the substrate 100 between the transferring chamber 240 and the first load-lock chamber 220a disposed at right side, and the lower robot arm 251b transfers the substrate 100 between the transferring chamber 240 and the second load-lock chamber 220b disposed at left side.

The transferring chamber robot 250 can move perpendicularly to the horizontal moving axis 271 to deliver the substrate 100 between the transferring chamber 240 and the load-lock chambers 220 or the process chambers 230 (in FIG. 2). In other words, with regard to the plane of FIG. 3A, the transferring chamber robot 250 moves upward/downward and rightward/leftward. Accordingly, unlike the related art transferring chamber robot 42 having a rotation with the substrate in FIG. 1, the transferring chamber robot 250 of the present invention has a straight-line motion, i.e., moves forward/reward, upward/downward and rightward/leftward, with the substrate 100.

A first door 281 is arranged between the transferring chamber 240 and the load-lock chamber 220. Depending upon opening and closing of the first door 281, the substrate 100 is delivered between the transferring chamber 240 and the load-lock chamber 220.

The load-lock chamber 220 may have at least two substrate slots 224 to place at least two substrates 100 thereon.

Figure 3B:
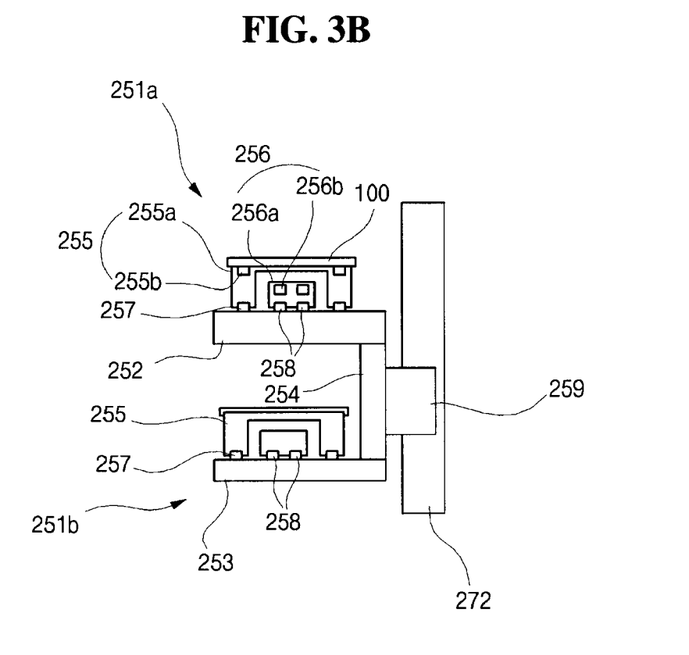
FIG. 3B is a side view of the transferring chamber robot of FIG. 3A.

With reference to FIGS. 3A and 3B, the transferring chamber robot will be explained in detail. FIG. 3B is a side view of the transferring chamber robot of FIG. 3A.

The transferring chamber robot 250 has a double-layered structure that the upper and lower robot arms 251a and 251b are arranged up and down, and the upper and lower robot arms 251a and 251b are connected to a combination means 254. The combination means 254 is connected to a vertical moving guide 259 of a vertical moving axis 272. The vertical moving axis 272 is connected to the horizontal moving axis 271 at one end thereof. Accordingly, the upper and lower robot arms 251a and 251b can move together in the transferring chamber 240.

The upper and lower robot arms 251a and 251b have upper and lower supporting means 252 and 253, respectively. Each upper and lower robot arms 251a and 251b has first and second sub-robot arms 255 and 256 on each upper and lower supporting means 252 and 253. The first and second sub-robot arms 255 and 256 move horizontally along first and second moving rails 257 and 258, respectively. The first sub-robot arm 255 has a first sub-robot arm body 255a connected to the first moving rail 257 and a first placing portion 255b where the substrate 100 is placed, and the second sub-robot arm 256 has a second sub-robot arm body 256a connected to the second moving rail 258 and a second placing portion 256b where the substrate 100 is placed.

Since the first and second moving rail 257 and 258 are arranged on the same plane, it is required that the first and second sub-robot arms 255 and 256 do not disturb movements of each other. Accordingly, as shown in FIG. 3B, the first moving rail 257 is arranged at outer portions of the supporting means 252 and 253, and the second moving rail 258 is arranged at inner portions of the supporting means 252 and 253. In other words, the second moving rail 258 is arranged between the first moving rails 257. Furthermore, the first placing portion 255*b* is higher than the second placing portion 256*b*, and the second sub-robot arm body 256*a* is arranged inside the first sub-robot arm body 255*a*. Therefore, the second sub-robot arm 256 is surrounded by the first sub-robot arm 255.

As each upper and lower robot arms 251*a* and 251*b* are the first and second sub-robot arms 255 and 256, inputting and outputting of the substrate 100 are conducted separately with the first and second sub-robot arms 255 and 256. Accordingly, an efficiency of transferring the substrate 100 can increase.

Figure 4:
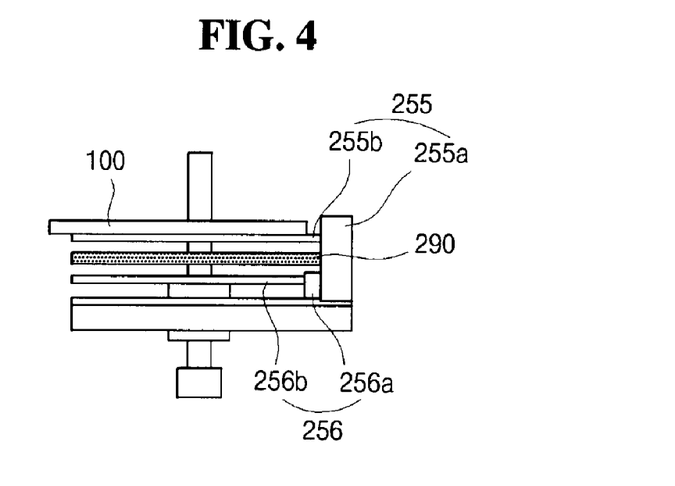
FIG. 4 is a cross-sectional view of a transferring chamber robot having a shielding means according to the first embodiment of the present invention.

FIG. 4 is a cross-sectional view of a transferring chamber robot having a shielding means according to the first embodiment of the present invention.

As shown in FIG. 4, a shielding means 290 is arranged between first and second sub-robot arms 255 and 256. The first and second sub-robot arms 255 and 256 have different heights from each other, and thus when the substrate 100 is transferred, it is contaminated by diffusion of particles which are caused by adjacent substrate 100. Accordingly, to prevent the substrate 100 being contaminated by diffusion of particles, the shielding means 290 is arranged between the first and second sub-robot arms 255 and 256.

Figure 5:
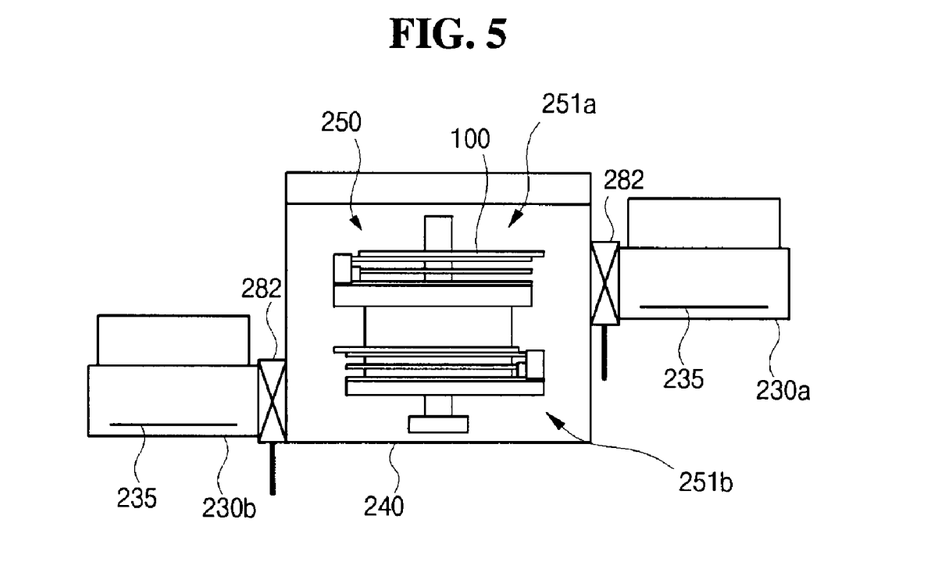
FIG. 5 is a cross-sectional view, which shows a connection structure of a transferring chamber and a process chamber, taken along a line IV-IV of FIG. 2.

FIG. 5 is a cross-sectional view, which shows a connection structure of a transferring chamber and a process chamber, taken along a line IV-IV of FIG. 2.

As shown in FIG. 5, a connection structure of a transferring chamber 240 and a process chamber 230 is similar to that of a transferring chamber 240 and a load-lock chamber 220 as shown in FIG. 3A. The process chambers 230 include first and second process chambers 230*a* and 230*b* which are arranged at both sides of the transferring chamber 240. The first and second process chambers 230*a* and 230*b* have different heights from each other, in other words, the first process chamber 230*a* may be higher than the second process chamber 230*b*. The first and second process chambers 230*a* and 230*b* facing each other may conduct the same process. The process chamber 230 has a susceptor 235 where the substrate 100 is placed to conduct process.

As above explained, a transferring chamber robot 250 includes upper and lower robot arms 251*a* and 251*b*, which have different heights from each other, to deliver effectively the substrate 100 between the process chamber 230 and the transferring chamber 240.

A second door 282 is arranged between the transferring chamber 240 and the process chamber 230. Depending upon opening and closing of the second door 282, the substrate 100 is delivered between the transferring chamber 240 and the process chamber 230.

In the above explained first embodiment, the transferring chamber robot 250 have the upper and lower robot arms 251*a* and 251*b* having different heights from each other, and each upper and lower robot arms 251*a* and 251*b* has the first and second sub-robot arms 255 and 256. However, the transferring chamber robot 250 may have other structures.

FIGS. 6 to 10B are cross-sectional views of a transferring chamber robot having structures different from that of FIG. 3A. In FIGS. 6 to 10, explanations of parts similar to parts in FIG. 3A will be omitted.

Figure 6:
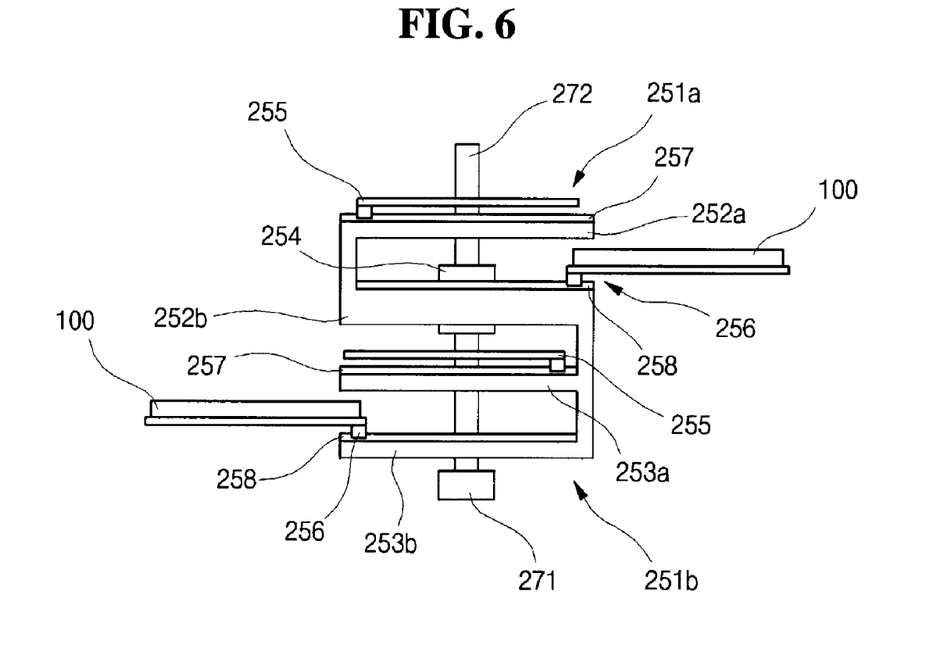

As shown in FIG. 6, an upper robot arms 251*a* may have an upper supporting means 252 including first and second supporting means 252*a* and 252*b*, which have different heights from each other. A lower robot arms 251*b* may have a lower supporting means 253 including third and fourth supporting means 253*a* and 253*b*, which have different heights from each other. First moving rails 257 are arranged on the first and third supporting means 252*a* and 253*a*, and second moving rails 258 are arranged on the second and fourth supporting means 252*b* and 253*b*. First and second sub-robot arms 255 and 256 move along the first and second moving rails 257 and 258, respectively. As such, each supporting means are arranged corresponding to each sub-robot arm. Accordingly, each supporting means can prevent diffusion of particles.

Figure 7:
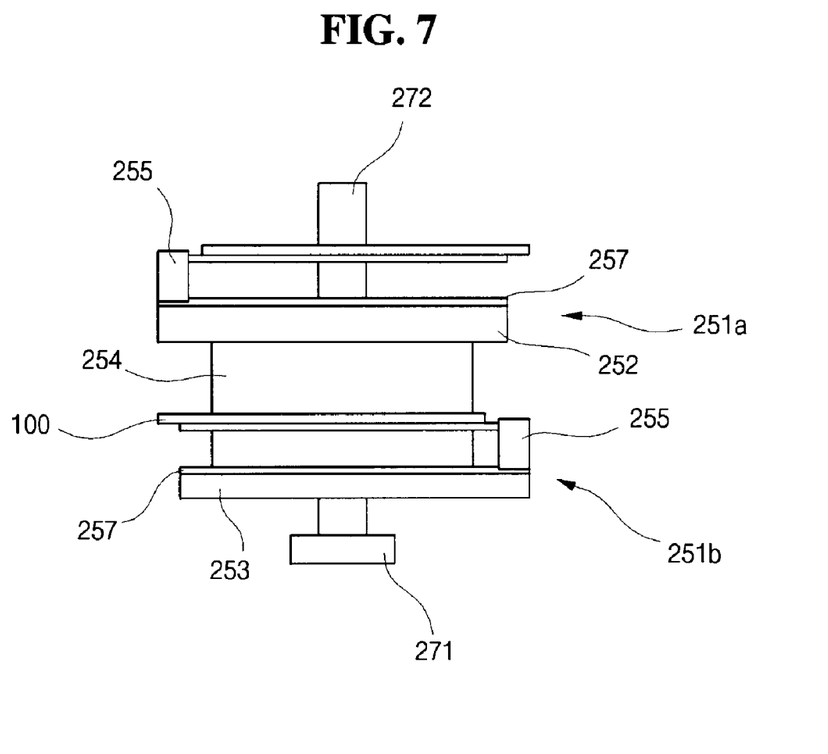

As shown in FIG. 7, each upper and lower robot arms 251*a* and 251*b* may have one sub-robot arm 255. Accordingly, upper and lower robot arms 251*a* and 251*b* have upper and lower supporting means 252 and 253, one moving rail 257 is arranged on each upper and lower supporting means 252 and 253, and the sub-robot arm 255 moves along the moving rail 257.

Figure 8:
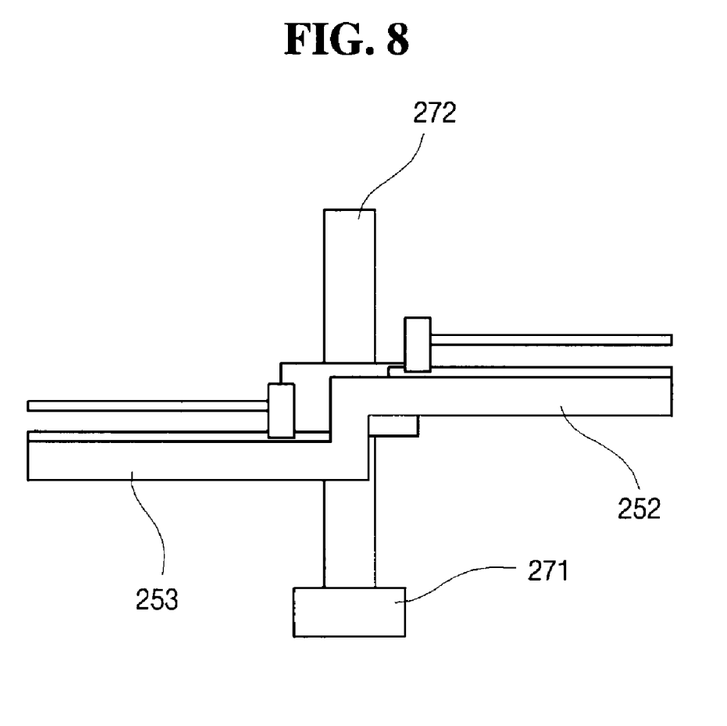

As shown in FIG. 8, an upper supporting means 252 at a higher layer may be arranged toward one side of the transferring chamber 240 (in FIG. 3A), and a lower supporting means 253 at a lower layer may be arranged toward other side of the transferring chamber 240 (in FIG. 3A). Such structure can prevent diffusion of particles.

Figure 9:
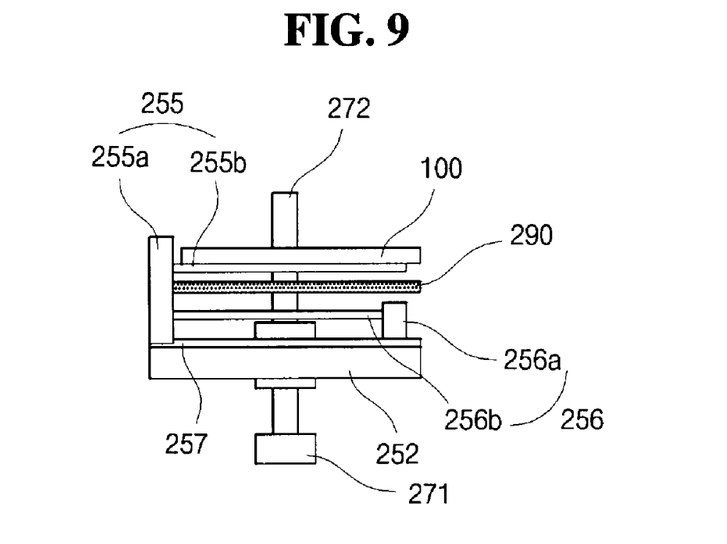

As shown in FIG. 9, a first moving rail 257 and a second moving rail (not shown) are arranged on a supporting means 252. Although not shown in FIG. 9, the second moving rail may be arranged inside the first moving rail 257 similarly to that of FIG. 3B. Furthermore, first and second sub-robot arms 255 and 256 move in opposition to each other. A shielding means 290 is arranged between first and second placing portions 255*b* and 256*b*. Such structure can prevent diffusion of particles, and utilization of spaces can increase.

In FIGS. 3A to 9, the load-lock chambers or the process chambers are arranged at both sides of the transferring chamber, and the sub-robot arms of the transferring chamber robot move toward both sides of the transferring chamber. However, the load-lock chambers or the process chambers may be arranged at one side of the transferring chamber, and the sub-robot arms may move toward one side of the transferring chamber.

Figure 10A:
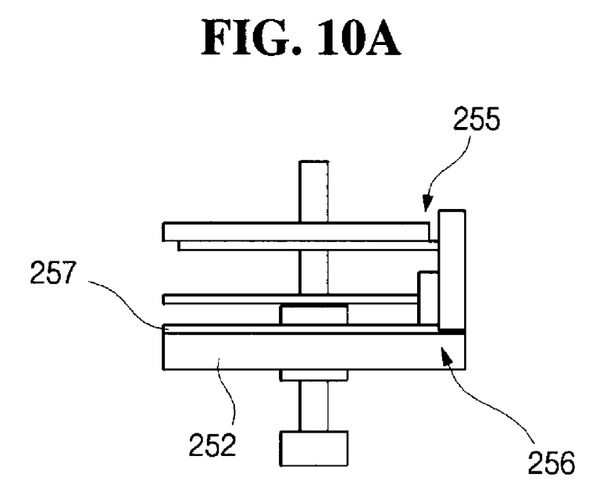
Figure 10B:
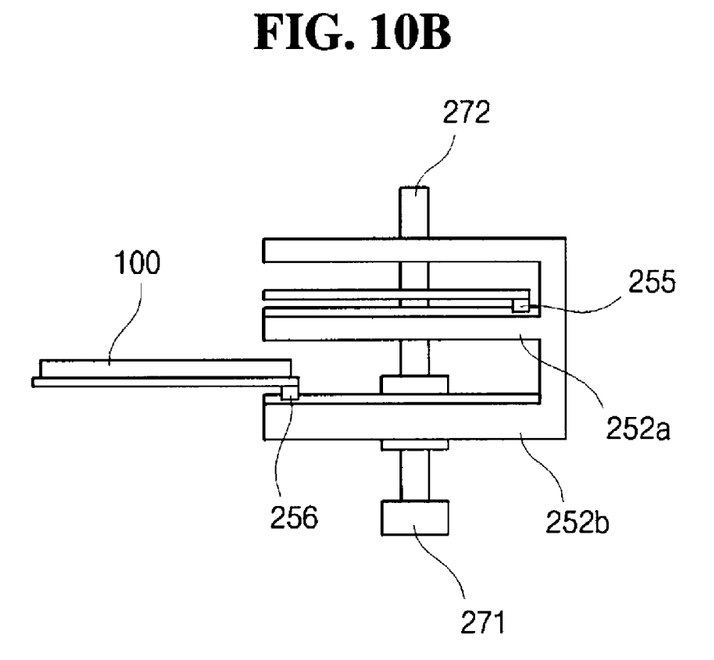

As shown in FIG. 10A, first and second sub-robot arms 255 and 256 may move toward one side of the transferring chamber 240 (in FIG. 3A) along a first moving rail 257 and a second moving rail (not shown) which are arranged on a supporting means 252. Furthermore, as shown in FIG. 10B, first and second sub-robot arms 255 and 256 may be, respectively, arranged on first and second supporting means 252*a* and 252*b* which have different heights from each other, and move toward one side of the transferring chamber 240 (in FIG. 3A).

Figure 11A:
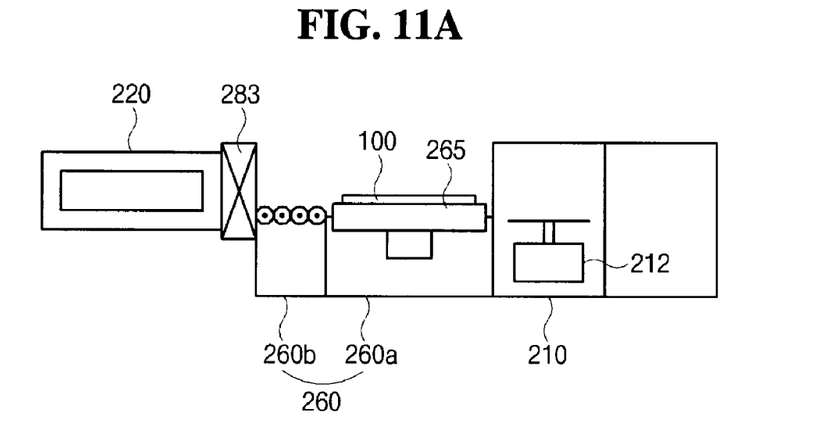
FIG. 11A is a cross-sectional view, which shows a connection structure of a storing portion, a delivering portion and a load-lock chamber, taken along a line Va-Va of FIG. 2.
Figure 11B:
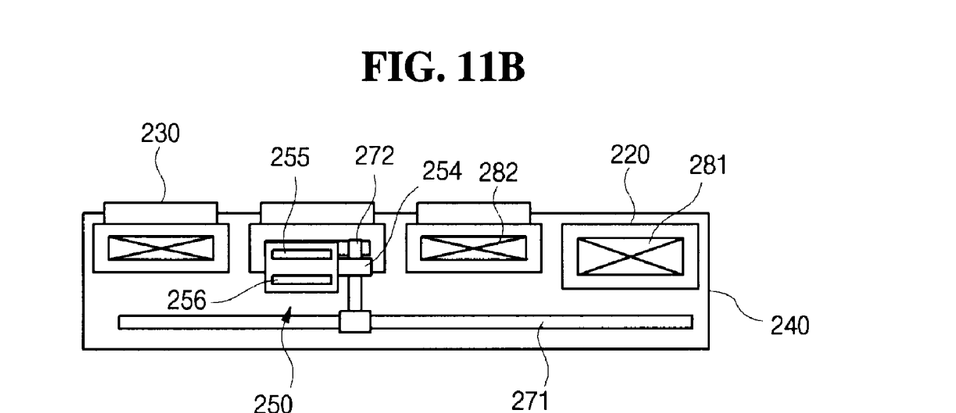
FIG. 11B is a cross-sectional view, which shows a connection structure of a transferring chamber, a process chamber and a load-lock chamber, taken along a line Vb-Vb of FIG. 2.
Figure 12:
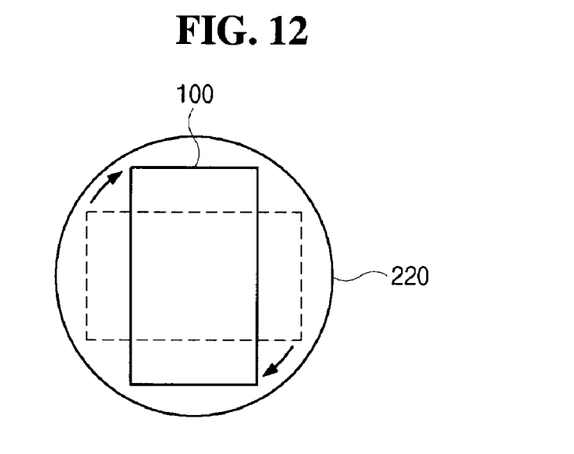
FIG. 12 is a view showing operation of a delivering portion according to the first embodiment of the present invention.

FIG. 11A is a cross-sectional view, which shows a connection structure of a storing portion, a delivering portion and a load-lock chamber, taken along a line Va-Va of FIG. 2. FIG. 11B is a cross-sectional view, which shows a connection structure of a transferring chamber, a process chamber and a load-lock chamber, taken along a line Vb-Vb of FIG. 2. FIG. 12 is a view showing operation of a delivering portion.

As shown in FIG. 11A, the delivering portion 260 has first and second delivering portions 260*a* and 260*b*, and is arranged between a storing portion 210 and a load-lock chamber 220. The first delivering portion 260*a* has a rotating means 265 operated by a motor (not shown) and rotating at 90 or 180 angles.

The rotating means 265 rotates the substrates 100 and delivers it from the storing portion 210 to a load-lock chamber 220. For example, with reference to FIG. 12, the substrate 100 is inputted into the first delivering portion 260*a*, and a short side of the substrate 100 is perpendicular to an inputting direction. The substrate 100 is rotated at 90 angles, as shown by arrow of FIG. 12. Then, the substrate 100 is inputted into the load-lock chamber 220, and a long side of the substrate 100 is perpendicular to an inputting direction.

Since the rotating means 265 is used to rotate the substrate 100, to deliver the rotated substrate 100 to the second delivering portion 260b, the first delivering portion 260a may have a delivering means such as a roller. To deliver the substrate 100 with respect to the short or long side thereof, the roller may include both x-axis and y-axis rollers. Furthermore, driving axes of both rollers may be moved upward and downward so that the required roller can rise and thus deliver the substrate.

The second delivering portion 260b delivers the substrate 100 using a conveyor, a roller and so on between the first delivering portion 260a and the load-lock chamber 220. A third door 283 is arranged between the second delivering portion 260b and the load-lock chamber 220, and opens or closes the load-lock chamber 220.

To deliver the substrate 100 to the load-lock chamber 220, the load-lock chamber 220 has a conveyor or a roller connected to a delivering means such as the roller of the second delivering portion 260b. For example, as a plate of the load-lock chamber 220, a roller plate where a plurality of rollers are protruded is used.

As shown in FIG. 11B, a transferring chamber robot 250 moves horizontally along a horizontal moving axis 271 and transfers a substrate 100 between a transferring chamber 240 and a load-lock chamber 220 or a process chamber 230. The transferring chamber robot 250 moves vertically along a vertical moving axis 272.

The transferring chamber robot 250 moves upward and downward along a vertical moving axis 272 so that the upper and lower robot arms can be located at the corresponding load-lock chambers 220 or the corresponding process chambers 230.

Instead of upward and downward moving of the transferring chamber robot 250, the horizontal moving axis 251 may move upward and downward.

Figure 13:
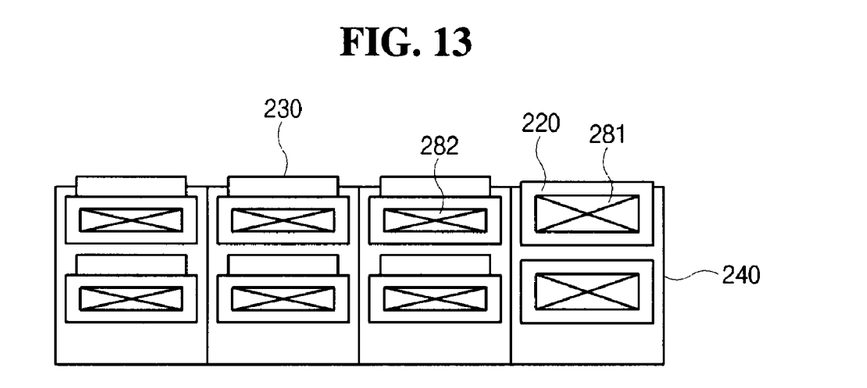
FIG. 13 is a view of a load-lock chamber and a process chamber having double-layered structures according to the first embodiment of the present invention.

FIG. 13 is a view of a load-lock chamber and a process chamber having double-layered structures according to the first embodiment of the present invention. As shown in FIG. 13, a load-lock chamber 220 and a process chamber 230 may have double-layered structures at one side or both sides of a transferring chamber 240. Furthermore, the load-lock chamber 220 and the process chamber 230 may have multiple-layered structures.

Figure 14:
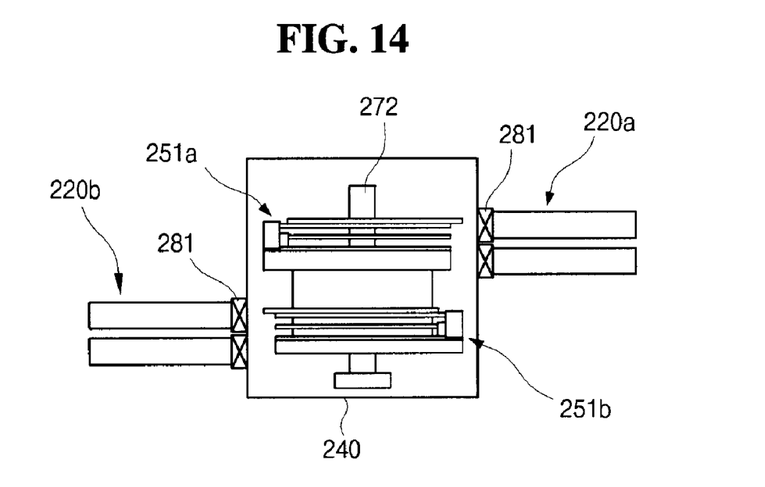
FIG. 14 is a cross-sectional view of a load-lock chamber having a double-layered structure according to the first embodiment of the present invention.

FIG. 14 is a cross-sectional view of a load-lock chamber having a double-layered structure according to the first embodiment of the present invention. As shown in FIG. 14, when the load-lock chambers 220 at both sides of a transferring chamber 240 have double-layered structures, upper and lower robot arms 251a and 251b moves upward and downward along a vertical moving axis 272, and transfers a substrate 100 between the transferring chamber 240 and first and second double-layered load-lock chambers 220a and 220b. Explanations of the double-layered load-lock chamber 220 may be adjusted to a double-layered process chamber.

Figure 15:
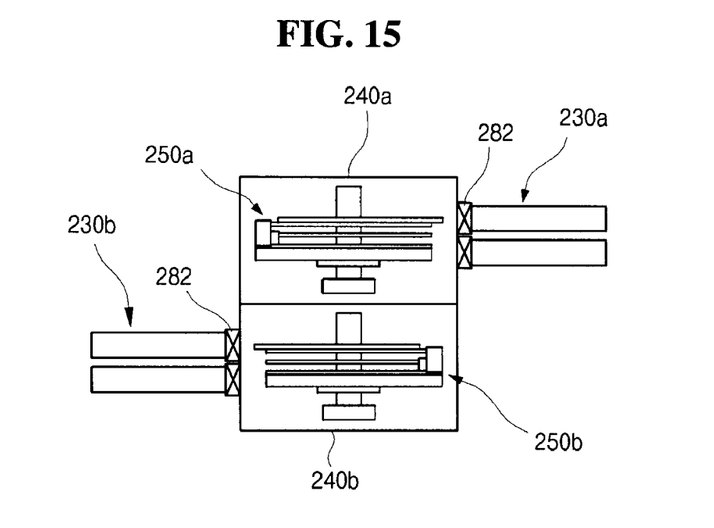
FIG. 15 is a cross-sectional view of a transferring chamber and a process chamber

FIG. 15 is a cross-sectional view of a transferring chamber and a process chamber having double-layered structures according to the first embodiment of the present invention.

As shown in FIG. 15, a double-layered transferring chamber 240 have upper and lower transferring chamber 240a and 240b. First and second double-layered process chambers 230a and 230b are arranged at both sides of the double-layered transferring chamber 240. In particular, the first double-layered process chamber 230a is connected to the upper transferring chamber 240a, and the second double-layered process chamber 230b is connected to the lower transferring chamber 240b.

Upper and lower transferring chamber robots 250a and 250b are arranged in the upper and lower transferring chamber 240a and 240b, respectively. The upper and lower transferring chamber robots 250a and 250b move along separate horizontal moving rails (not shown). Although not shown in FIG. 15, a load-lock chamber may have a double-layered structure.

Hereinafter, moving process of the substrate will be explained according to the first embodiment of the present invention.

At first, a storing portion robot 212 delivers a substrate 100 from a storing portion 210 to a first delivering portion 260a. The delivered substrate 100 is rotated at 90 angles by a rotating means 265, and then the substrate 100 is inputted into a load-lock chamber 220 through a second delivering portion 260b. At this time, the load-lock chamber 220 is under atmospheric pressure, and a first door 281 is closed.

When the substrate 100 is placed in the load-lock chamber 220, a third door 283 is closed, and a pumping process is conducted to make the load-lock chamber 220 under vacuum.

When vacuum of the load-lock chamber 220 is equal to that of the process chamber 230 or the transferring chamber 240, the first door 281 is open and the transferring chamber robot 250 outputs the untreated substrate 100 from the load-lock chamber 220.

The transferring chamber robot 250 moves along a horizontal moving axis 271, and transfers the substrate 100 into the process chamber 230.

When the substrate 100 is inputted into the process chamber 230 and a corresponding process is finished, the transferring chamber robot 250 goes into the process chamber 230 and outputs the substrate 100 from the process chamber 230. Then, the transferring chamber robot 250 having the substrate 100 moves along the horizontal moving axis 271 and transfers the substrate 100 to the process chamber 230 where next process is conducted.

When all processes are finished in the process chambers 230, the substrate 100 is transferred reversely to above explained orders. In other words, the substrate 100 is delivered to the load-lock chamber 220 by the transferring chamber robot 250, and then the substrate 100 is delivered to the second delivering portion 260b and the first delivering portion 260a. Then, the substrate 100 is rotated at 90 angles on the first delivering portion 260a, and then the substrate 100 is outputted to the storing portion 210 by the storing portion robot 212.

In the above explained first embodiment, to transfer the substrates 100 between the storing portion 210 and the delivering portion 260, the storing portion robot 212 is used. As such, when the storing portion robot 212 is used to transfer the substrates 100, the substrates 100 is loaded in a cassette (not shown) and the cassette is transferred to the storing portion 210 by an AGV (automatic guided vehicle). However, if the substrates 100 are transferred not by the AGV but by an in-line type device using a conveyor, roller and so on, the storing portion 210 and the storing portion robot 212 may not be required. Therefore, to transfer the substrates 100 to the delivering portion 260, the in-line type device may be used. The in-line type device may be connected to the delivering portion so that the substrates 100 can be directly inputted to the delivering portion 260. Furthermore, the process-finished substrates 100 may be outputted to the in-line type device through the delivering portion 100 or other delivering portion.

Figure 16:
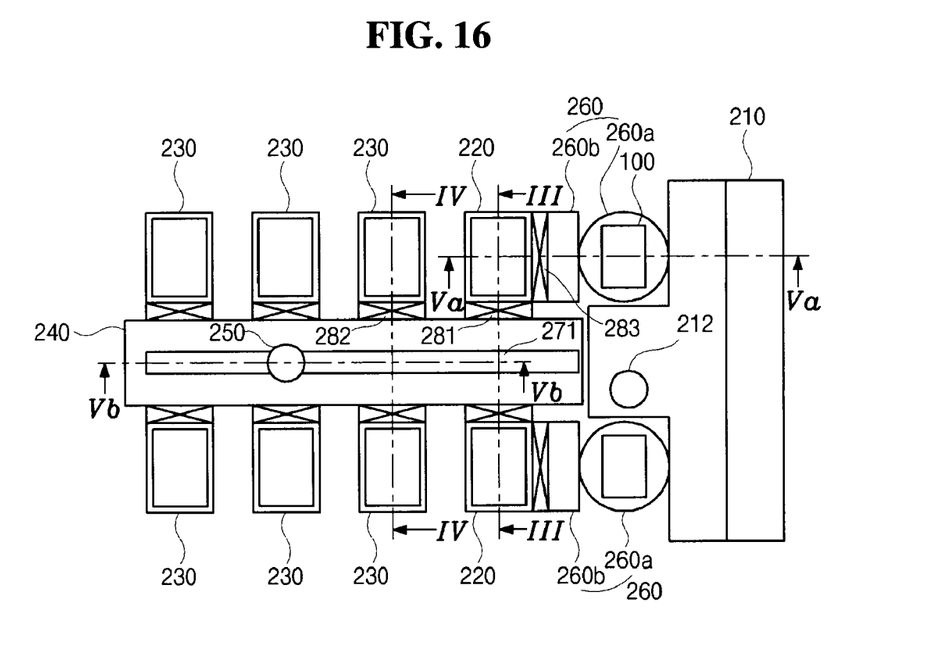
FIG. 16 is a view of an apparatus for manufacturing a substrate different from that of FIG. 2 according to the first embodiment of the present invention.

In the above explained first embodiment, with respect to FIG. 2, the substrate 100 is transferred with regard to the short side thereof perpendicular to a transferring direction between the transferring chamber 240 and the load-lock chamber 220 or the process chamber 230. The reason is that the long sides of the load-lock chamber 220 and the process chamber 230 are perpendicular to the long side of the transferring chamber 240. Accordingly, the substrate 100 is inputted with respect to the short side thereof from the storing portion 210 to the delivering portion 260, then the substrate 100 is rotated at 90 angles, and then the substrate 100 is inputted to the load-lock chamber 220. However, as shown in FIG. 16, which is a view of an apparatus for manufacturing a substrate different from that of FIG. 2 according to the first embodiment of the present invention, the substrate 100 may be inputted from other side of the delivering portion 260 different from that of FIG. 2. In other words, the transferring direction of the substrate 100 from the storing portion 210 to the delivering portion 260 is perpendicular to the transferring direction of the substrate 100 from the delivering portion 260 to the load-lock chamber 220, as is contrary to FIG. 2. Therefore, although the substrate 100 is transferred with respect to the short side thereof in FIG. 16, it is not required that the substrate is rotated in the delivering portion 260.

Figure 17:
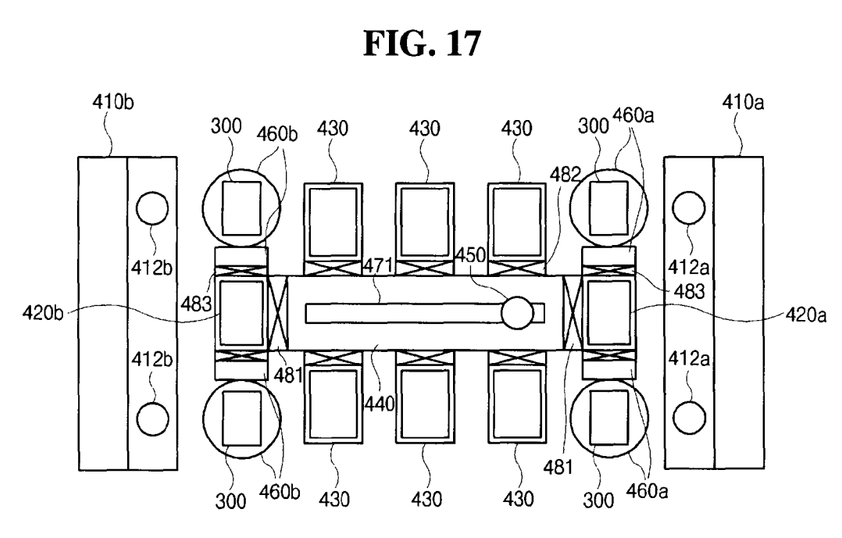
FIG. 17 is a view of an apparatus for manufacturing a substrate according to the second embodiment of the present invention.

FIG. 17 is a view of an apparatus for manufacturing a substrate according to the second embodiment of the present invention. In the second embodiment, explanations of parts similar to parts in the first embodiment will be omitted.

As shown in FIG. 17, in an apparatus for manufacturing a substrate of the second embodiment, a plurality of load-lock chambers 420 and a plurality of storing portions 410 are both ends of a transferring chamber 440. The load-lock chambers 420 include an inputting chamber 420a at one end of the transferring chamber 440 and an outputting chamber 420b at other end of the transferring chamber 440. The storing portions 410 include an inputting storing portion 410a at one end of the transferring chamber 440 and an outputting storing portion 410b at other end of the transferring chamber 440. A first door 481 is arranged between the transferring chamber 440 and the load-lock chamber 420, a second door 482 is arranged between the transferring chamber 440 and the process chamber 430, and a third door 483 is arranged between the load-lock chamber 420 and the delivering portion 460. Inputting and outputting storing portion robots 412a and 412b are arranged in the inputting and outputting storing portions 410a and 410b, respectively.

The inputting storing portion 410a stores an untreated substrate 300. The substrate 300 inputted from the inputting storing portion 410a is delivered to the transferring chamber 440 through the inputting load-lock chamber 420a. The process-finished substrate 300 is delivered to the outputting storing portion 410b through the transferring chamber 440 and the outputting load-lock chamber 420b. To output the substrate 300 from the transferring chamber 440 to the outputting load-lock chamber 420b, a transferring chamber robot 450 may have a transferring means, for example, a means rotating a robot arm of the transferring chamber robot 450 or a means making the robot arm move in a straight line to the outputting load-lock chamber 420b.

An inputting delivering portion 460a is arranged between the inputting storing portion 410a and the inputting load-lock chamber 420a, and an outputting delivering portion 460b is arranged between the outputting storing portion 410b and the outputting load-lock chamber 420b. The inputting and outputting delivering portions 460a and 460b rotates and deliver the substrate 300 like the delivering portion of the first embodiment. In other words, the untreated substrate 300 is inputted to the inputting delivering portion 460a with respect to a short side of the substrate 300 perpendicular to the inputting direction, then the inputting delivering portion 460a rotates the substrate at 90 angles, and then the substrate 300 is inputted to the inputting load-lock chamber 420a with respect to the short side of the substrate 300 perpendicular to the inputting direction. Furthermore, the process-finished substrate 300 is outputted from the outputting load-lock chamber 420b with respect to the short side of the substrate 300 perpendicular to the outputting direction, then the outputting delivering portion 460b rotates the substrate at 90 angles, and then the substrate 300 is outputted to the outputting storing portion 410b with respect to the short side of the substrate 300 perpendicular to the outputting direction. As not shown in FIG. 17, the inputting and outputting delivering portions 460a and 460b may include a delivering means like the second delivering portion of the first embodiment.

In the second embodiment, since the load-lock chambers 420 are arranged at both ends of the transferring chamber 440, the substrate 300 is delivered between the load-lock chamber 420 and the transferring chamber 440 with respect to a long side of the substrate 300 perpendicular to the delivering direction.

In the above explained second embodiment, the substrate 300 moves sequentially through the inputting load-lock chamber 420a, the process chamber 430 and the outputting load-lock chamber 420b. However, it would not be required that each load-lock chambers 420 at both ends of the transferring chamber 440 should correspond to each inputting and outputting load-lock chambers 420a and 420b. In other words, the substrate 300 may be inputted through the storing portion 410a, the delivering portion 460a and the load-lock chamber 420a disposed at right of FIG. 17, and then be outputted reversely to the inputting orders. Furthermore, the substrate 300 may be inputted through the storing portion 410b, the delivering portion 460b and the load-lock chamber 420b disposed at left of FIG. 17, and then be outputted reversely to the inputting orders. Furthermore, the substrate 300 may be inputted through the storing portion 410b, the delivering portion 460b and the load-lock chamber 420b disposed at left of FIG. 17, and then be outputted through the load-lock chamber 420a, the delivering portion 460a and the storing portion 410a disposed at right of FIG. 17.

In the apparatus for manufacturing the substrate according to the present invention, the transferring chamber has an In-Line type structure, and the process chambers can be arranged at sides of the transferring chamber. Therefore, the process chambers can be easily connected to the transferring chamber without restriction of a number and an arrangement. Furthermore. An increase rate of the transferring chamber and the process chamber for increase of the substrate can be reduced.

It will be apparent to those skilled in the art that various modifications and variations can be made in the apparatus for manufacturing the substrate distributing means without departing from the spirit or scope of the invention. Thus, it is intended that the present invention covers the modifications and variations of this invention provided they come within the scope of the appended claims and their equivalents.

What is claimed is:

1. An apparatus for transferring a substrate, the apparatus comprises:
   a transfer robot arm comprising:
      a first sub-robot arm and a second sub-robot arm arranged over a supporting means; and
      an inner rail and an outer to the inner rail overlying the supporting means, wherein the first sub-robot arm is adapted to move in a straight line motion along the inner rail and the second sub-robot arm is adapted to move in a straight line motion along the outer rail, wherein the second sub-robot arm surrounds the first sub-robot arm.

2. The robot of claim 1, wherein the inner rail and the outer rail are arranged on the same plane.

3. An apparatus comprising:
a transferring chamber;
a process chamber coupled to the transferring chamber;
at least one load-lock chamber coupled to the transferring chamber; and
a transferring chamber robot in the transferring chamber to transfer a substrate,
wherein the transferring chamber robot includes upper and lower robot arms having different heights from each other,
wherein the upper and lower robot arms comprise upper and lower supporting means, respectively,
wherein the upper robot arm comprises first and second moving rails on the upper supporting means, the upper robot arm comprising first and second sub-robot arms adapted to move along the first and second moving rails, respectively, and
wherein the first moving rail is arranged at an outer portion of the upper supporting means and the second moving rail is arranged at an inner portion of the upper supporting means such that the first sub-robot arm surrounds the second sub-robot arm.

4. The apparatus according to claim 3,
wherein the lower robot arm comprises third and fourth moving rails on the lower supporting means, the lower robot arm comprising third and fourth sub-robot arms adapted to move along the third and fourth moving rails, respectively, and
wherein the third moving rail is arranged at an outer portion of the lower supporting means and the fourth moving rail is arranged at an inner portion of the lower supporting means such that the third sub-robot arm surrounds the fourth sub-robot arm.

5. The apparatus according to claim 4, wherein each of the first, second, third and fourth sub-robot arms includes a sub-robot arm body connected to the corresponding moving rail and a placing portion on which the substrate is placed.

6. The apparatus according to claim 3, wherein the process chamber comprises a first process chamber and a second process chamber, wherein the upper robot arm extends in a horizontal direction to access the first process chamber and the lower robot arm extends in an opposite horizontal direction to access the second process chamber.

7. The apparatus according to claim 3, further comprising:
a horizontal moving axis coupled to the transferring chamber robot; and
a vertical moving axis connected in perpendicular to the horizontal moving axis and coupled to the transferring chamber robot.

8. The apparatus according to claim 3,
wherein the transferring chamber has first and second long sides opposite to each other; and first and second short sides,
wherein the transferring chamber robot is configured to move in a first direction parallel to the first and second long sides in a straight line-motion along a horizontal plane,
wherein the transferring chamber robot is configured to move in a second direction perpendicular to the first direction along a moving rail in a straight line-motion along the horizontal plane, and
wherein the transferring chamber robot is configured to move in a third direction perpendicular to the horizontal plane in a straight line-motion.

9. The apparatus according to claim 8, wherein the process chamber is connected to at least one of the first and second long sides of the transferring chamber.

10. The apparatus according to claim 8, wherein the at least one load-lock chamber includes first and second load-lock chambers respectively connected to the first and second long sides of the transferring chamber.

11. The apparatus according to claim 8, wherein the at least one load-lock chamber includes first and second load-lock chambers respectively connected to the first and second short sides of the transferring chamber.

12. The apparatus according to claim 3, further comprising a shielding means between the first and second sub-robot arms.

13. The apparatus according to claim 3, wherein the transferring chamber has at least a double-layered structure, each layer of the transferring chamber having the corresponding transferring chamber robot.

14. The apparatus according to claim 3, further comprising a storing portion to load the substrate, and a delivering portion connecting the at least one load-lock chamber and the storing portion, wherein the delivering portion includes a delivering means to deliver the substrate to the at least one load-lock chamber.

15. The apparatus according to claim 14, wherein the delivering means includes a conveyor and a roller.

16. The apparatus according to claim 15, wherein the delivering portion includes a rotating means to rotate the substrate.

17. The apparatus according to claim 3, further comprising a combination means connecting the transferring chamber robot to a vertical moving guide, wherein the vertical moving guide is connected to a vertical moving axis, the vertical moving axis being connected to a horizontal moving axis at one end thereof.

18. The apparatus according to claim 17, wherein the first and second load-lock chambers have different heights from each other.

19. The apparatus of claim 3, wherein the process chamber includes a first process chamber and a second process chamber,
the transferring chamber having first and second long sides opposite to each other,
the first process chamber connected to the first long side of the transferring chamber;
a second process chamber connected to the second long side of the transferring chamber.

20. The apparatus of claim 19, wherein the first and second process chambers are at different heights.

* * * * *